United States Patent
Addington et al.

(10) Patent No.: US 7,332,263 B2
(45) Date of Patent: Feb. 19, 2008

(54) METHOD FOR PATTERNING AN ORGANIC LIGHT EMITTING DIODE DEVICE

(75) Inventors: Cary G Addington, Albany, OR (US); Qiong Chen, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 551 days.

(21) Appl. No.: 10/830,508

(22) Filed: Apr. 22, 2004

(65) Prior Publication Data

US 2005/0236975 A1    Oct. 27, 2005

(51) Int. Cl.
*H01J 9/227*    (2006.01)
(52) U.S. Cl. ............... 430/321; 430/945; 219/121.69; 445/24
(58) Field of Classification Search ............... None
See application file for complete search history.

(56) References Cited

U.S. PATENT DOCUMENTS 4,885,448 A * 12/1989 Kasner et al. ......... 219/121.69

2004/0051446 A1 * 3/2004 Werner et al. ............ 313/504

FOREIGN PATENT DOCUMENTS

JP    2003-297568 A * 10/2003

* cited by examiner

*Primary Examiner*—John A. McPherson

(57) ABSTRACT

A method for laser patterning of a passive matrix organic light emitting diode device having a multilayered structure comprising a substrate and at least one light emitting organic layer disposed between two electrode layers, the method comprising the step of: irradiating areas of the multilayered structure with a laser beam in a predetermined pattern thereby causing ablation of the multilayered structure in the irradiated areas; wherein, the electrode layers and the light emitting organic layer or layers are patterned substantially simultaneously during the same irradiation operation. Also described are a passive matrix organic light emitting diode device patterned by the method of the present invention and a display comprising the same.

10 Claims, 7 Drawing Sheets

METHOD FOR PATTERNING AN ORGANIC LIGHT EMITTING DIODE DEVICE

FIELD OF THE INVENTION

The present invention relates generally to patterning of conductive films and more particularly to methods of patterning an organic light emitting diode device using a laser ablation process.

BACKGROUND OF THE INVENTION

A typical organic light emitting diode (OLED) device, as illustrated in FIG. 1, is an electronic device including a multilayered structure 100 including an organic layer 104 disposed between an anode 106 and a cathode 108. The organic layer 104 typically comprises a hole transport layer 112 and an electron transport layer 114 and may further include a luminescent layer 110 disposed between the hole transport 112 and electron transport layers 114. The substrate 102 typically comprises glass but may be formed from another light, flexible, transparent material such as a plastic. In a typical OLED device, the anode layer 106 comprises indium tin oxide (ITO) and the cathode layer 108 is metallic containing metallic materials such as silver, gold, calcium or magnesium.

Providing an electrical charge to the electrodes induces formation of charged molecules within the hole transport and electron transport layers. These charged molecules recombine in the luminescent layer to produce light by electroluminescence.

A primary application of OLED device technology is in flat panel displays as an alternative to liquid crystal displays (LCDs). OLED displays offer a number of advantages over LCD technology including that they are flexible and provide a wider viewing angle and superior colour resolution. Since OLED devices are self-luminous, they do not require backlighting and therefore consume significantly less energy than LCDs. Further more, OLED displays are potentially faster, lighter and brighter than LCDs.

An OLED display comprises an array of pixels deposited on a substrate in a matrix of rows and columns. Each pixel consists of a light emitting diode formed at the intersection of each column and row. There are two types of OLED displays, active matrix and passive matrix. In a passive matrix display, each pixel is illuminated by applying an electrical charge to the row and column that intersect to define that pixel. In an active matrix display, each light emitting diode is associated with a thin film transistor, which controls the amount of current flowing through the OLED.

Passive matrix OLED devices are manufactured by depositing the various layers of the multilayered OLED device onto a substrate and patterning the electrode layers into a plurality of discrete conductive elements. Conventional patterning processes include photolithographic and chemical etching techniques. However, OLED materials and device structures tend to be incompatible with conventional patterning techniques. Exposure to oxygen, water vapour and chemicals in the process of patterning the cathode layer may cause degradation of the underlying organic layers. Furthermore, conventional patterning techniques create additional problems including structural defects or contamination of the substrate causing the OLED to be susceptible to electrical shorts.

Laser ablation techniques involve the removal of portions of layers of electrically conductive and insulating materials in accordance with a predetermined pattern by exposing the selected areas to a laser beam. These techniques have demonstrated the potential to offer faster and more accurate production of OLED devices. It is possible to directly pattern conductive films by laser without the need for multi-step processes involved in photolithography such as mask preparation, exposure, developing and etching.

Patterning of the cathode using existing techniques typically results in a series of "mushroom" structures as shown in FIG. 2. The passive matrix OLED device 200 shows the configuration of the "mushroom" structures 210 formed during a conventional patterning process. The OLED device 200 comprises an indium-tin oxide anode 206 deposited on a glass substrate 202 and an organic light-emitting layer 204 disposed between the anode layer 206 and the cathode layer 208. The "mushroom" structures 210 are configured such that they generally do not have parallel walls. That is, the base 212 of the "mushroom" 210, has a smaller cross section than the upper portion 214 of the "mushroom" 210. In addition, the cathode layer 208 may be encapsulated with an encapsulating layer 216 to protect the metallic cathode 208.

The configuration described prevents optimum performance from being achieved. Small variations in the slant of the "mushroom" wall can be the difference between the device being, or not being, susceptible to electrical shorts. Another cause of electrical shorts is an excessively sharp slant causing the "mushroom" to collapse during the baking process.

Furthermore, the methods described usually leave the organic layers and the cathode layer unpatterned, leading to cross talk between neighbouring pixels. Attempts have been made to combat this problem by replacing the low resistivity hole transport layer with a high resistivity layer. However, this solution compromises the conductivity of the organic layers thereby reducing overall performance and efficiency of the device. Moreover, the methods currently employed for patterning of OLED devices are considered to be too complex, slow and costly for high volume manufacturing.

SUMMARY OF THE INVENTION

Briefly, the present invention provides a method for patterning a passive matrix organic light emitting diode device having a multilayered structure comprising a substrate and at least one light emitting organic layer disposed between two electrode layers. The method comprises irradiating areas of the multilayered structure with a laser beam in a predetermined pattern to cause ablation of the multilayered structure in the irradiated areas. The electrode layers and the light emitting organic layer or layers are patterned substantially simultaneously during the same irradiation operation.

BRIEF DESCRIPTION OF THE DRAWINGS

The invention will now be described in further detail by reference to the attached drawings illustrating example forms of the invention. It is to be understood that the particularity of the drawings does not supersede the generality of the preceding description of the invention. In the drawings.

DETAILED DESCRIPTION OF THE DRAWINGS

Figure 1:
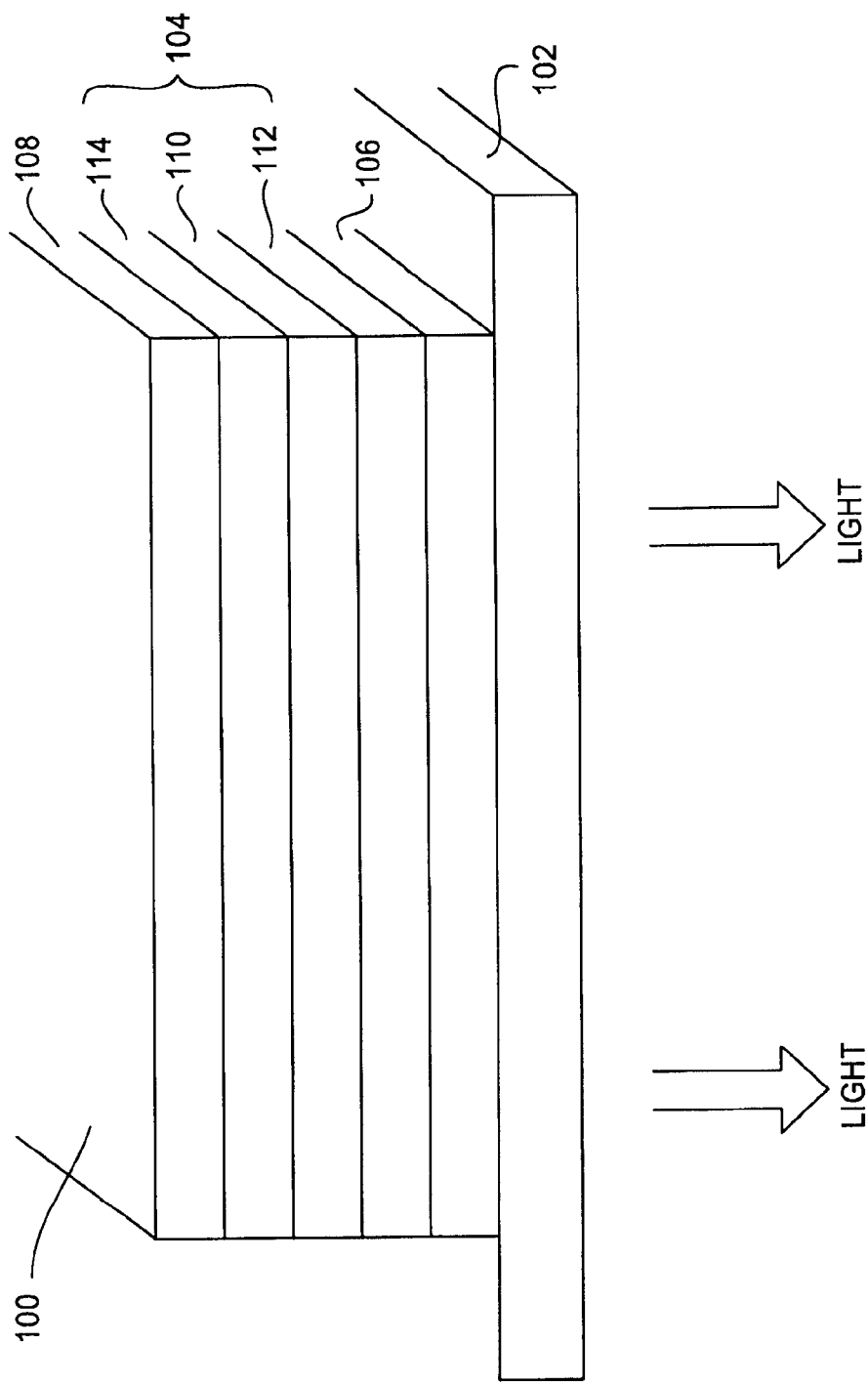
FIG. 1 is a perspective view of a prior art multilayered OLED device.
Figure 2:
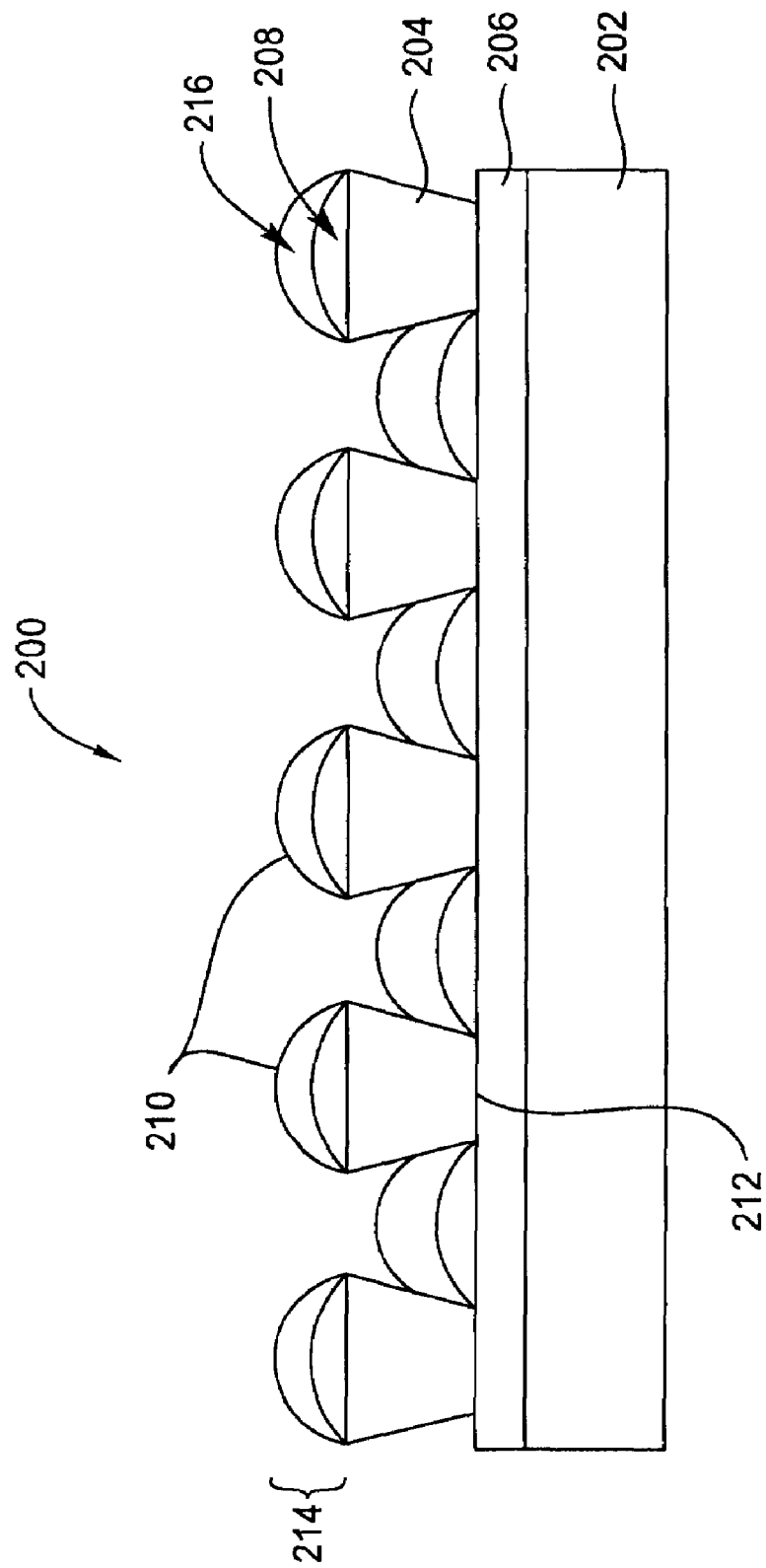
FIG. 2 is a prior art passive matrix OLED device showing the "mushroom" structures resulting from a conventional patterning process.
Figure 3:
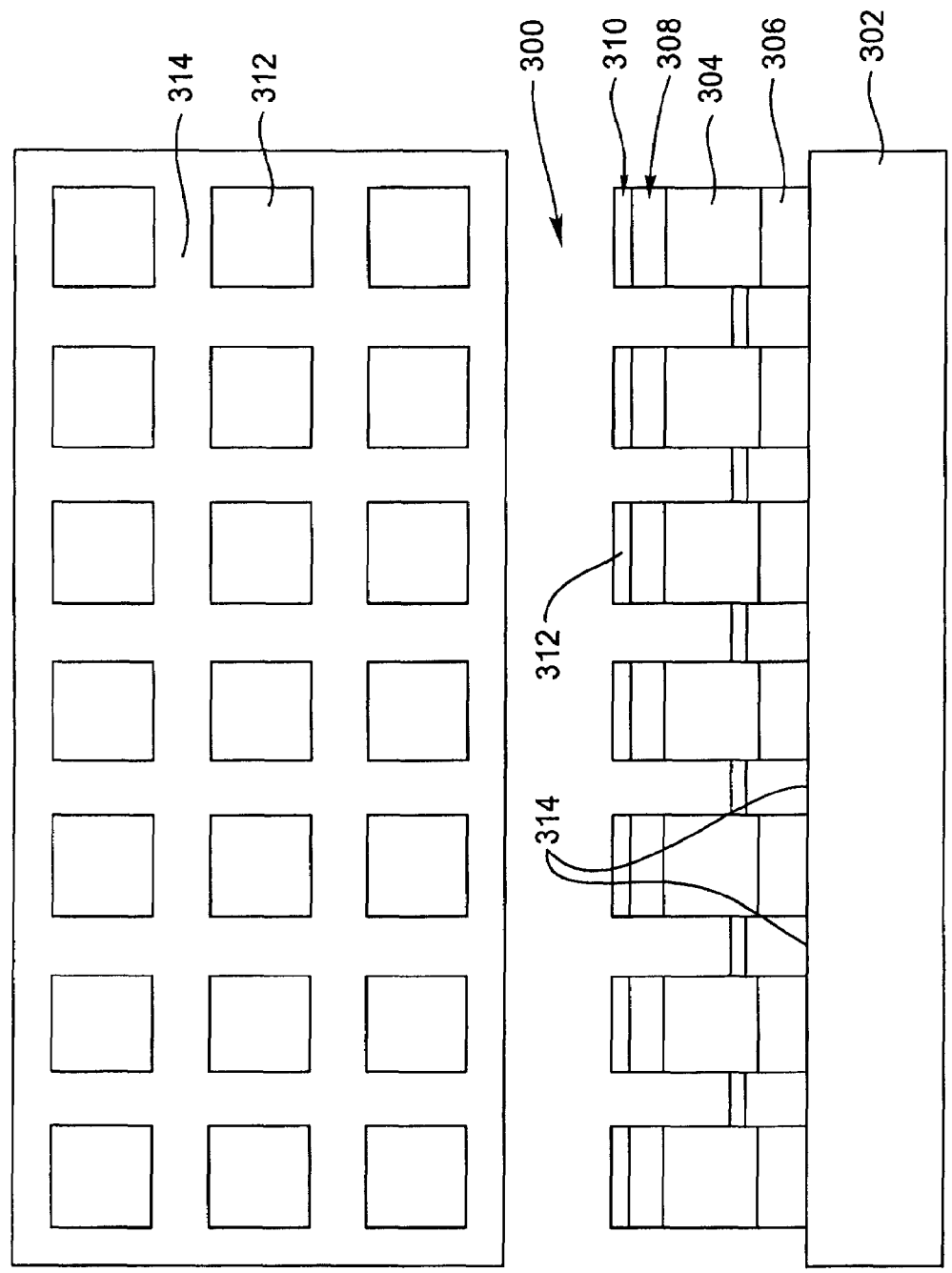
FIG. 3 is a passive matrix OLED device showing the "mushroom" structures resulting from the laser patterning process in accordance with an embodiment of the present invention.

FIG. 3 illustrates the configuration of a passive matrix OLED device 300 patterned according to the laser patterning method in accordance with an embodiment. The passive matrix organic light emitting diode device 300 has a multilayered structure including a substrate 302 and at least one light emitting organic layer 304 disposed between two electrode layers 306,308. In addition, the cathode layer 308 may be encapsulated with an encapsulating layer 310 due to the high reflectivity of the metallic cathode 308. The encapsulating layer 310 should have a high degree of absorption of ultraviolet light in order to enhance the efficiency of the laser patterning process.

The substrate 302 includes glass but may be formed from any other suitable transparent material such as plastic. The light emitting organic layer 304 may include single or multiple layers of organic film, but may comprise a polymer luminescent layer 110 disposed between a hole transport 112 layer and an electron transport layer 114. The electrode layers include an anode layer 306 and a cathode layer 308. The anode layer 306 may include indium-tin oxide (ITO) and the cathode layer 308 includes any suitable metallic material such as Mg, Ag, Ca, Au or the like or any suitable combination thereof.

Patterning of the multilayered OLED device 300 by laser ablation involves the removal of portions of irradiated layers in accordance with a predetermined pattern. The photon energy of the laser beam breaks the molecular bonds within the multilayered structure and superheats the materials resulting in vaporization and/or expulsion of the irradiated materials. As the outer layer is removed, the underlying layers will be exposed to the laser beam causing further ablation. Since OLED structures are very thin (a few hundred nanometres), the laser beam appears to pattern the entire multilayered structure substantially simultaneously in a single irradiation operation.

Figure 4:
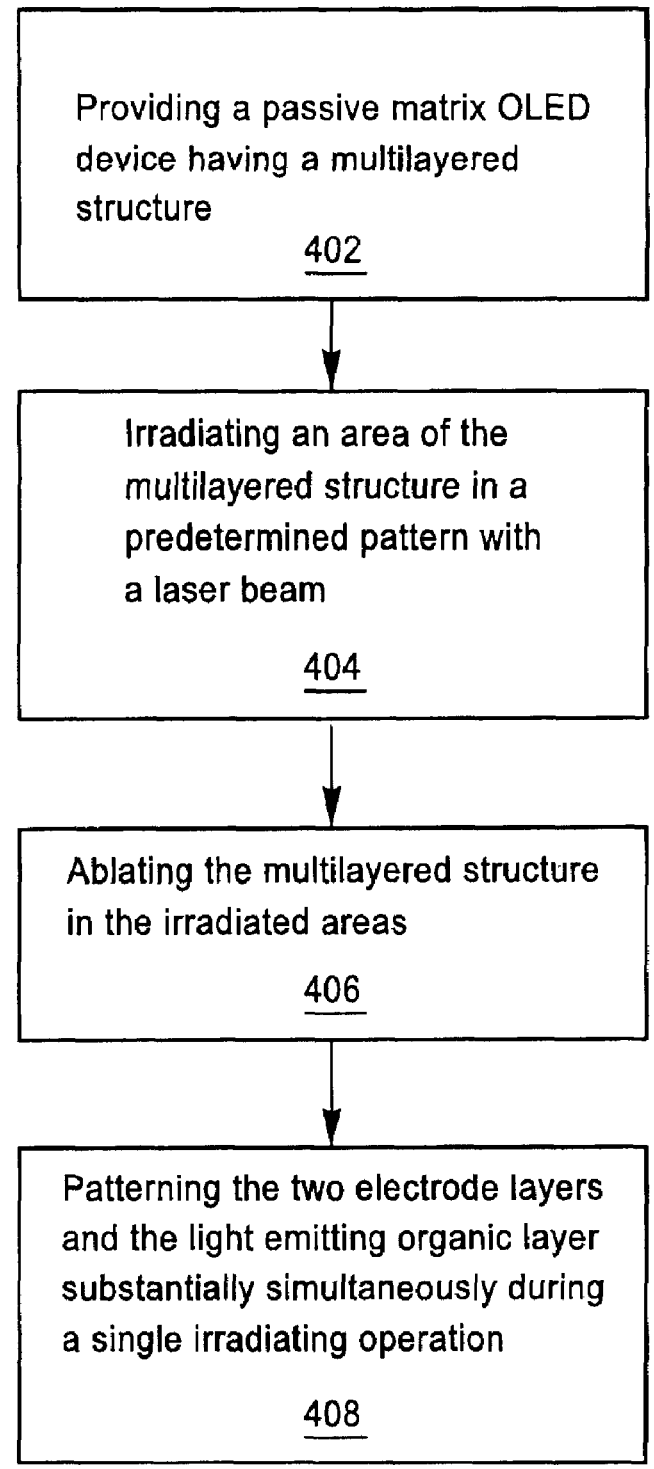
FIG. 4 is a flowchart outlining the major steps in a method provided in accordance with an embodiment of the present invention.

FIG. 4 is a flowchart outlining a method for patterning a multilayered structure in accordance with an embodiment. Step 402 includes providing a passive matrix OLED device having a multilayered structure. In an embodiment, the multilayered structure includes a substrate, at least one light emitting organic layer and two electrode layers. Step 404 includes irradiating an area of the multilayered structure in a predetermined pattern with a laser beam. Step 406 includes ablating the multilayered structure in the irradiated areas. A final step 408 includes patterning the two electrode layers and the light emitting organic layer substantially simultaneously during a single irradiation operation.

The capacity to ablate the entire structure in a single irradiation operation negates the need for conventional multi step procedures. The single step method provides more accurate and rapid patterning of OLED devices than conventional methods. This simplification in the production process leads to an increase in manufacturing efficiency.

Referring back to FIG. 3, the "pillar" structures 312 formed by the disclosed method have substantially parallel sides and a substantially uniform cross section throughout their height. This more clearly defined form of "pillar" structures 312 minimises the occurrence of cross talk between pixels and precludes the collapse of the "pillar" structures 312 during baking. The laser patterning process described is a dry process allowing increased accuracy, faster production of OLED devices, and may further allow the use of highly efficient electro-luminescent materials having low electrical resistivity. Each of these advantages contributes to an overall reduced cost of manufacture of OLED devices.

Laser patterning produces a residue consisting of electrically conductive material or plasma. The plasma must be removed from the spaces between the electrodes or "pillars" 312 to prevent electrical shorts and to ensure optimum performance. The method may include an additional step providing for removal of any debris or plasma expelled during the ablation process. Removal occurs via any suitable means including suction or blower systems. The patterning and removal steps may occur simultaneously.

In one embodiment, the irradiating laser beam has a short pulse width. A pulse width in the order of a few nanoseconds or picoseconds is considered to be suitable. The short pulse width allows the laser beam to achieve high laser peak power with low intensity and/or fluence. Multiple layers may be patterned during a very short duration of exposure to the laser beam. The heat generated by irradiation by the laser beam diffuses through the irradiated layer into underlying layers to a depth that may be related to the laser pulse width. Therefore, superior control and accuracy can be achieved with a laser beam of short pulse width.

A method in accordance with an embodiment involves a dry process thereby negating the need for wet acids or solvents which are often required with conventional patterning techniques. The method may be performed in a controlled gas environment comprising nitrogen or inert gas to shield the cathode layer from oxygen which may cause degradation thereof. Where a laser beam having a super short pulse width (that is, a picosecond pulse width) is applied, effective laser patterning may be achieved without a controlled gas environment.

The method in accordance with an embodiment may be performed by irradiating the cathode layer 308 of the OLED structure with the laser beam. The cathode layer 308 is irradiated with a laser beam having an energy density exceeding the ablation threshold level of the cathode layer 308, thereby causing substantially simultaneous ablation of the multilayered structure in the irradiated areas. The laser beam is selected to have a sufficient energy density to ablate the cathode layer 308, since the cathode layer 308 usually has the highest ablation or vaporization threshold relative to other materials in the multilayered structure. Residual debris or plasma material may be removed by a suction system. As a result of the method, cathode layer 308, the anode layer 306 and the light emitting organic layer 304 disposed there between are all substantially simultaneously ablated during a single irradiation operation.

The cathode 308 is highly reflective to ultra violet and has a high degree of thermal conductivity. Therefore, the laser beam selected to perform the patterning method is chosen on the basis of having an energy density sufficient to exceed the ablation or vaporization threshold of the cathode layer 308.

Any suitable laser beam having a wavelength with an energy density sufficient to exceed the ablation or vaporization threshold of the cathode layer 308 could be used to perform the patterning method according to varying embodiments. For example, the method could be performed by a laser beam selected from laser beams including but not limited to a 248 nm or 308 nm excimer laser or a 355 nm Nd:Yag laser. An excimer generated laser beam 502 exhibiting the following parameters has been used to perform the patterning method:

| Wavelength | 248 nm |
|---|---|
| Pulse Width | 30 ns |
| Pulse Energy | 440 mJ |
| Frequency | 250 Hz |
| Fluency | <1000 mJ/cm$^2$ |
| Shot Count | 2 to 5 pulses/20 nm ITO |

On irradiating the upper surface of the cathode layer 308, the surface is superheated to the point where the irradiated molecules are vaporized. Once the irradiated section of the cathode layer 308 has been ablated the laser beam 502 will irradiate and vaporize the underlying layers 304,306.

Figure 5:
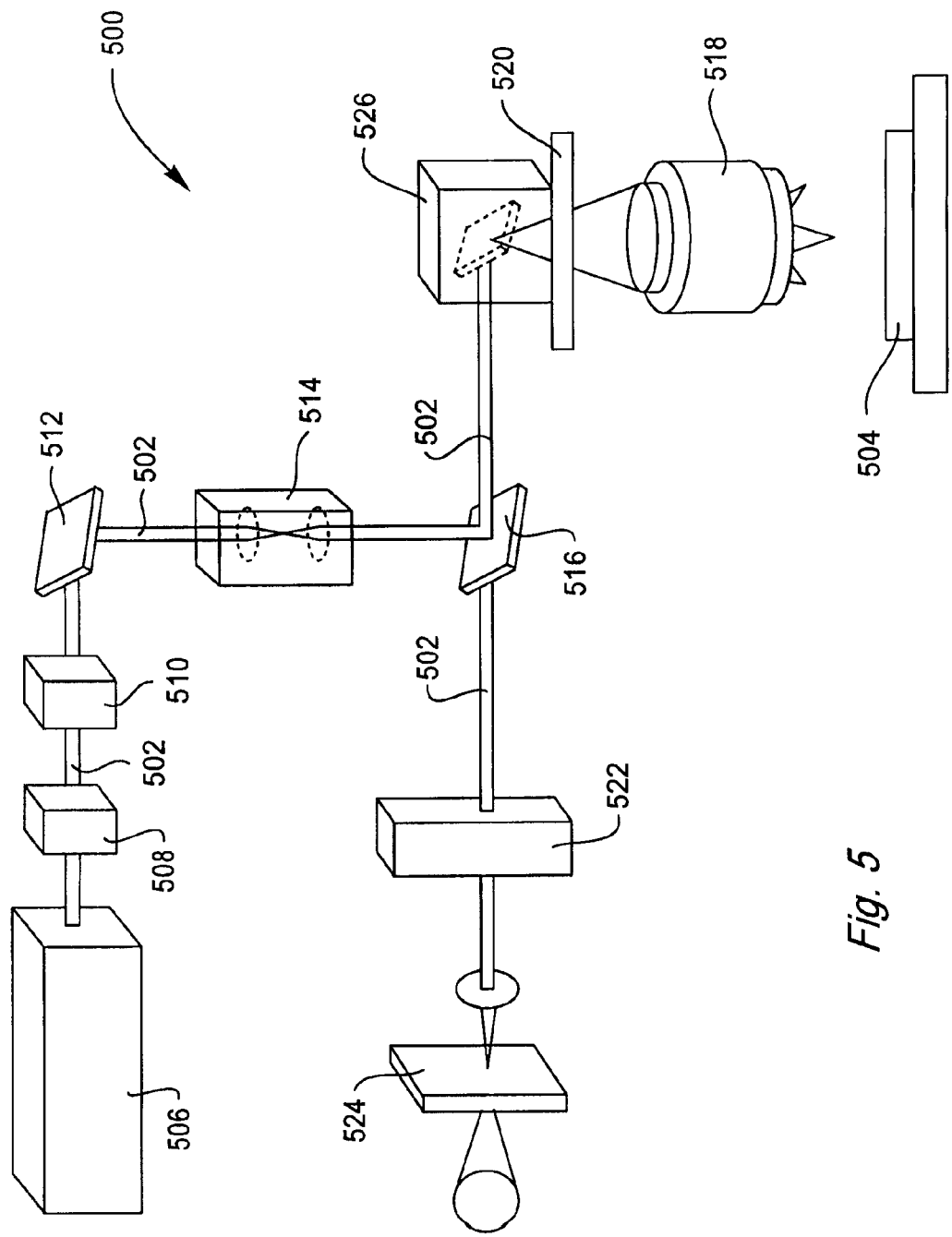
FIG. 5 is a schematic diagram of an example of an excimer laser patterning system for use with an embodiment of the present invention.

FIG. 5 illustrates a schematic diagram of an example of a laser ablation system 500 for use with an embodiment wherein the upper layer of the multilayered OLED device 504 targeted by the laser beam is the metallic cathode layer. The laser ablation system 500 includes an excimer laser projection system 506. The system 500 further includes an attenuator 508, a homogenizer 510, a mirror 512 and a field lens 514 to redistribute the laser beam 502. The redistributed laser beam 502 is directed to a fold mirror 516 which directs the beam 502 through a projection lens 518 via a mirror 526 tilted at 45°. The projection lens 518 transfers the mask 520 onto the OLED device 504. The system 500 further includes a detector 522 and a beam analyser 524 which provides for analysis of the laser beam 502 in real time in accordance with parameters such as pulse intensity, output power, pulse energy distribution and the like.

Alternatively, referring back to FIG. 3, the ablation method of a described embodiment may be performed by irradiating areas of the anode layer 306 through the substrate 302. As in the previously described methods, the anode layer 306, the cathode layer 308 and the light emitting organic layer 304 disposed there between are patterned substantially simultaneously during the same irradiation operation simultaneously.

This alternative method may be performed using a laser beam 502 to irradiate the anode layer 306 through the substrate 302. The focus point of the laser beam is on the surface of cathode layer 308. Focusing the laser beam on the cathode layer 308 causes patterning to be initiated at the cathode layer. This is desirable since the cathode layer 308 typically has the highest ablation or vaporization threshold relative to other materials in the multilayered structure. Focusing the laser beam on the cathode layer 308 also prevents damage to the substrate 302 which may exhibit high absorption of UV light.

The laser beam is selected to have an energy density which will readily ablate or vaporize the cathode layer 308. As the irradiated portion of the cathode layer 308 is vaporized, the heat is transferred from the cathode layer 308 through to the organic layer 304. The organic layer 304 is thereby ablated and the heat generated is transferred through to the anode layer 306. In fact, due to the very thin nature of the multilayered OLED structure, the entire process appears to occur simultaneously.

In an embodiment, the laser beam is selected to irradiate the anode layer 306 and is a laser beam including ultra violet light having a wavelength of 355 nm with pulse width in the range of picoseconds. This laser beam may be derived from a Nd:Yag laser. For example, the method could be performed by a Nd:Yag laser beam exhibiting the following beam characteristics:

| Wavelength | 355 nm |
|---|---|
| Pulse Width | 12 ps |

Figure 6:
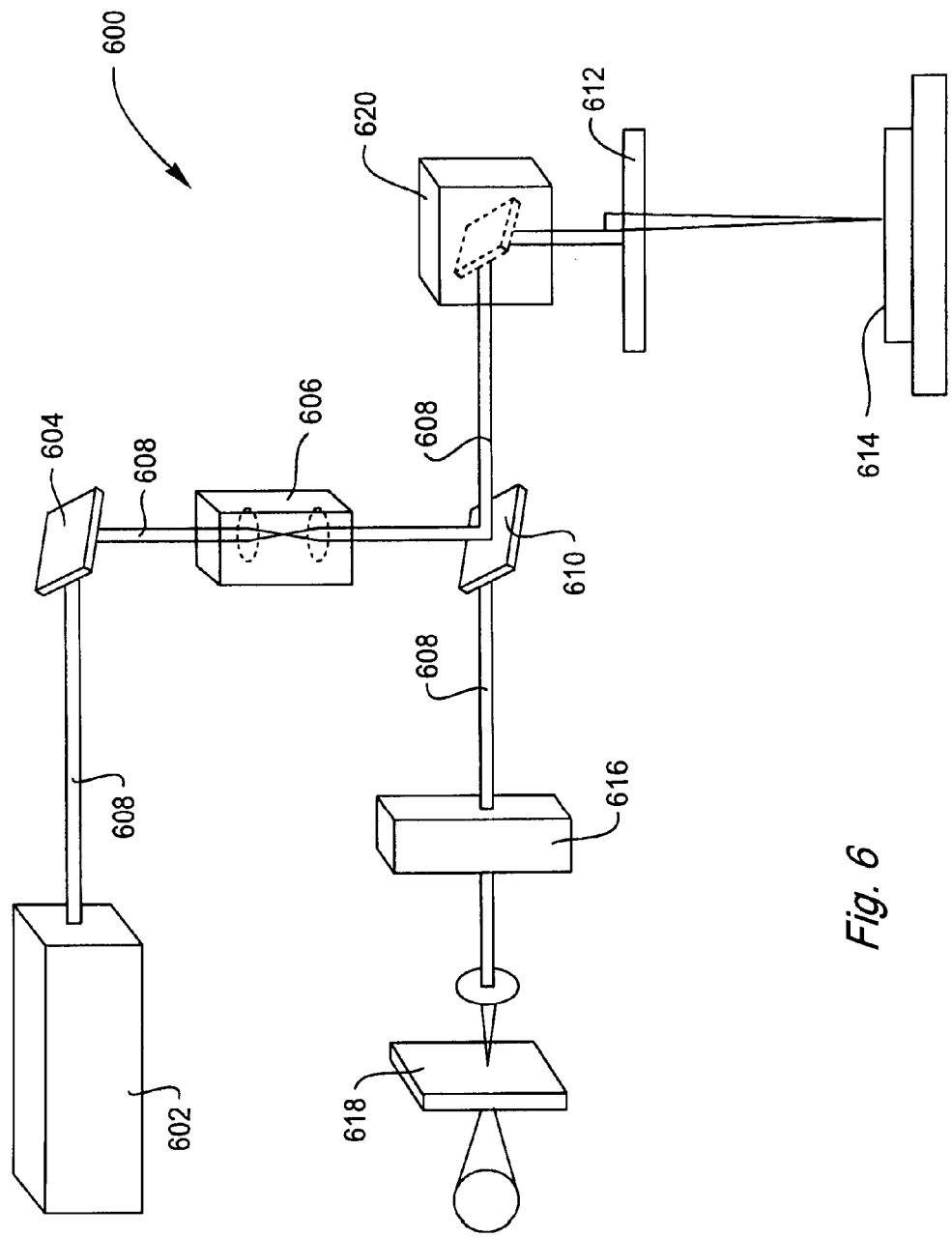
FIG. 6 is a schematic diagram of a Nd:Yag laser patterning system for use with another embodiment of the present invention.

FIG. 6 illustrates a schematic diagram of a laser patterning system 600 suitable for use with the ablation method which irradiates the anode. The laser ablation system 600 includes a Nd:Yag laser generator 602. The system 600 further includes a mirror 604 and a beam expander 606 to redistribute the laser beam 608. The redistributed laser beam 608 is directed to a fold mirror 610 which direct the beam 608 through a focus lens 612 via a mirror 620 tilted at 45° wherein the beam 608 is directed to irradiate and pattern the OLED device 614. The system 600 further includes a detector 616 and a beam analyser 618 which provide for analysis of laser beam 608 parameters such as pulse energy, output power, energy density and monitoring the position of the beam 608 in real time.

Figure 7:
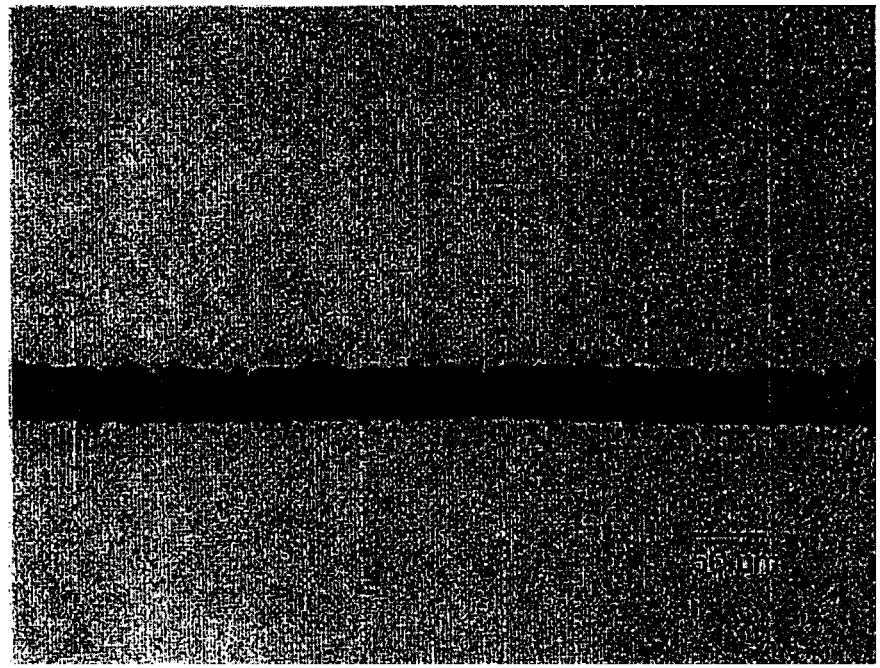
FIG. 7 is a photograph of a laser pattern made with an ultra violet light Nd:Yag laser with nanoseconds pulse width in accordance with an embodiment of the present invention.
Figure 8:
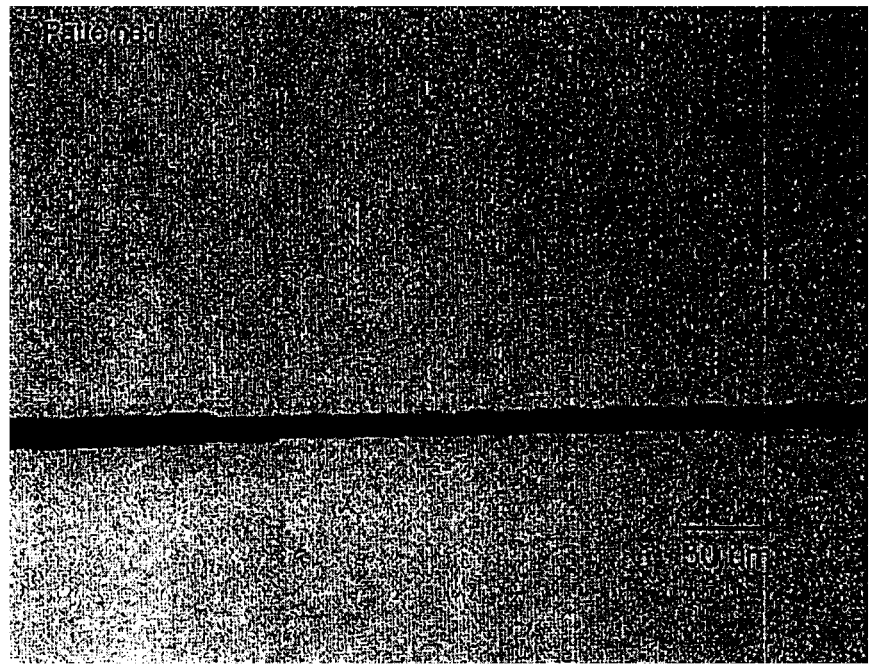
FIG. 8 is a photograph of a laser pattern made with an ultra violet light Nd:Yag laser with picosecond pulse width in accordance with an embodiment of the present invention.

FIGS. 7 and 8 show a samples of patterns made by the ultra violet light Nd:Yag laser with pulse width in the range of nanoseconds and picoseconds respectively.

The passive matrix organic light emitting diode device patterned according to the method of the varying embodiments may be used directly as a display. Subsequent to application of the patterning method, no further processing is required. Therefore an electric current may be applied directly to an organic light emitting device provided by the method to illuminate a display.

While the embodiments of the present invention have been illustrated in detail, it should be apparent that modifications and adaptations to these embodiments may occur to one skilled in the art without departing from the scope of the invention as set forth in the following claims.

We claim:

1. A method for patterning a passive matrix organic light emitting diode device having a multilayered structure, said method comprising:

providing a substrate having a multilayered structure formed thereon, said multilayered structure comprising an anode layer formed on the substrate, at least one light emitting organic layer formed on the anode layer, and a cathode layer formed on said at least one light emitting organic layer;

irradiating areas of the cathode layer in a predetermined pattern using a laser beam having a pulse width in a nanosecond or a picosecond range and an energy density exceeding the ablation threshold of the cathode layer to thereby cause ablation of the multilayered structure in the irradiated areas;

wherein, the anode layer, the cathode layer and the at least one light emitting organic layer are patterned substantially simultaneously during the same irradiation operation.

2. A method for patterning a passive matrix organic light emitting diode device according to claim 1, including the further step of removing any residual material expelled during laser patterning.

3. A method for patterning a passive matrix organic light emitting diode device according to claim 1, wherein the laser beam comprises ultra violet radiation having a wavelength less than 355 nm.

4. A method for patterning a passive matrix organic light emitting diode device according to claim 1, wherein the anode layer comprises indium tin oxide (ITO) and the cathode layer comprises a metallic material.

5. A method for patterning a passive matrix organic light emitting diode device according to claim 4, wherein the laser beam has a wavelength of 248 nm and a pulse width of 30 nanoseconds.

6. A method for patterning a passive matrix organic light emitting diode device having a multilayered structure, said method comprising:

providing a substrate having a multilayered structure formed thereon, said multilayered structure comprising an anode layer formed on the substrate, at least one light emitting organic layer formed on the anode layer, and a cathode layer formed on said at least one light emitting organic layer;

irradiating areas of the anode layer through the substrate in a predetermined pattern with a laser beam having a pulse width in a picosecond range and an energy density exceeding the ablation threshold of the cathode layer to thereby cause ablation of the multilayered structure in the irradiated areas;

wherein, the anode layer, the cathode layer and the light emitting organic layer are patterned substantially simultaneously during the same irradiation operation.

7. A method for patterning a passive matrix organic light emitting diode device according to claim 6, wherein irradiation of the anode layer through the substrate occurs with the laser beam focused on the cathode layer.

8. A method for patterning a passive matrix organic light emitting diode device according to claim 6, including the further step of removing any residual material expelled during laser patterning.

9. A method for patterning a passive matrix organic light emitting diode device according to claim 6, wherein the anode layer comprises indium tin oxide (ITO) and the cathode layer comprises a metallic material.

10. A method for patterning a passive matrix organic light emitting diode device according to claim 9, wherein the laser beam has a wavelength of 335 nm and a pulse width of 20 picoseconds.

* * * * *